United States Patent
Hoefler (12) 
(10) Patent No.: US 9,117,534 B2
(45) Date of Patent: Aug. 25, 2015

(54) FUSE CIRCUIT WITH TEST MODE

(71) Applicant: Alexander B. Hoefler, Austin, TX (US)

(72) Inventor: Alexander B. Hoefler, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 91 days.

(21) Appl. No.: 14/161,927

(22) Filed: Jan. 23, 2014

(65) Prior Publication Data

US 2015/0206594 A1 Jul. 23, 2015

(51) Int. Cl.
*G11C 17/16* (2006.01)
*G11C 29/00* (2006.01)

(52) U.S. Cl.
CPC ............ *G11C 17/16* (2013.01); *G11C 29/00* (2013.01)

(58) Field of Classification Search
CPC ............................. G11C 17/16; G11C 29/785
USPC .......... 365/96, 185.04, 210.14, 210.15, 225.7
See application file for complete search history.

(56) References Cited

U.S. PATENT DOCUMENTS 5,548,555 A * 8/1996 Lee et al. ...................... 365/200
7,532,057 B2   5/2009 Aipperspach et al.

OTHER PUBLICATIONS

Safran, J. et al., "A Compact eFuse Programmable Array Memory for SOI CMOS", 2007 IEEE Symposium on VLSI Circuits Digest of Technical Papers, Jun. 14-16, pp. 72-73.

* cited by examiner

*Primary Examiner* — Alexander Sofocleous
*Assistant Examiner* — Alfredo Bermudez Lozada
(74) *Attorney, Agent, or Firm* — David G. Dolezal; James L. Clingan, Jr.

(57) ABSTRACT

During a program operation of a fuse cell of a fuse circuit, all of a group of select transistors of a fuse cell are made conductive to program the fuse cell. During a test operation of a fuse cell of the fuse circuit, less than all of the group of select transistors are made conductive so that current less than a programming current flows through the fuse cell.

20 Claims, 4 Drawing Sheets

| TEST | ADDRESS | WORD LINE ASSERTED |
|---|---|---|
| 0 | XXX 000 | WLS0[0-5] |
| 0 | XXX 001 | WLS1[0-5] |
| 0 | XXX 010 | WLS2[0-5] |
| 0 | XXX 011 | WLS3[0-5] |
| 0 | XXX 100 | WLS4[0-5] |
| 0 | XXX 101 | WLS5[0-5] |
| 1 | XXX 000 | WLS0[0], WLS1[0], WLS2[0], WLS3[0], WLS4[0], WLS5[0] |
| 1 | XXX 001 | WLS0[1], WLS1[1], WLS2[1], WLS3[1], WLS4[1], WLS5[1] |
| 1 | XXX 010 | WLS0[2], WLS1[2], WLS2[2], WLS3[2], WLS4[2], WLS5[2] |
| 1 | XXX 011 | WLS0[3], WLS1[3], WLS2[3], WLS3[3], WLS4[3], WLS5[3] |
| 1 | XXX 100 | WLS0[4], WLS1[4], WLS2[4], WLS3[4], WLS4[4], WLS5[4] |
| 1 | XXX 101 | WLS0[5], WLS1[5], WLS2[5], WLS3[5], WLS4[5], WLS5[5] |

FUSE CIRCUIT WITH TEST MODE

BACKGROUND OF THE INVENTION

1. Field of the Invention

This invention relates in general to fuse circuits and more specifically to fuse circuits with a test mode.

2. Description of the Related Art

Some electronic systems utilize fuses for non volatility storing information. In one embodiment, the fuses are implemented in a fuse circuit in an array of fuse cells that are addressable.

In some systems, it is desirable to test the components of the system prior to the implementation of those components in a system. For example, it may be desirable to perform a "burn in" test to test the circuit after manufacturing. In one example of a burn in test, the component may be subjected to higher voltages and/or higher temperatures to determine whether a component will perform properly over its intended lifetime.

With fuses being one time programmable devices, it is difficult to test the programming circuits and test each fuse under programming conditions without programming the fuse.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a fuse circuit includes a bit line with a number of fuse cells where each fuse cell is connected to a number of select lines that are individually controllable for selecting the cell during fuse circuit operations. In one embodiment, the select lines are word lines that are connected to fuse cells of multiple bit lines of a fuse cell array. During a regular program operation of a fuse cell, all of the select lines to a cell (or all of the programming select lines to the cell) are asserted to program the fuse cell. During a "programming" test operation, less than all (e.g. one) of the select lines to a cell are asserted where a program voltage is applied to the bit line during the programming test operation. During the programming test operation, one select line is also asserted to each of a set of other fuse cells connected to the bit line so that the programming voltage applied to the bit line does not generate a current sufficient through any one fuse to blow the fuse. During such a programming test operation, the programming voltage source, the bit line, and the select transistors can be tested under programming conditions without blowing the fuses.

Figure 1:
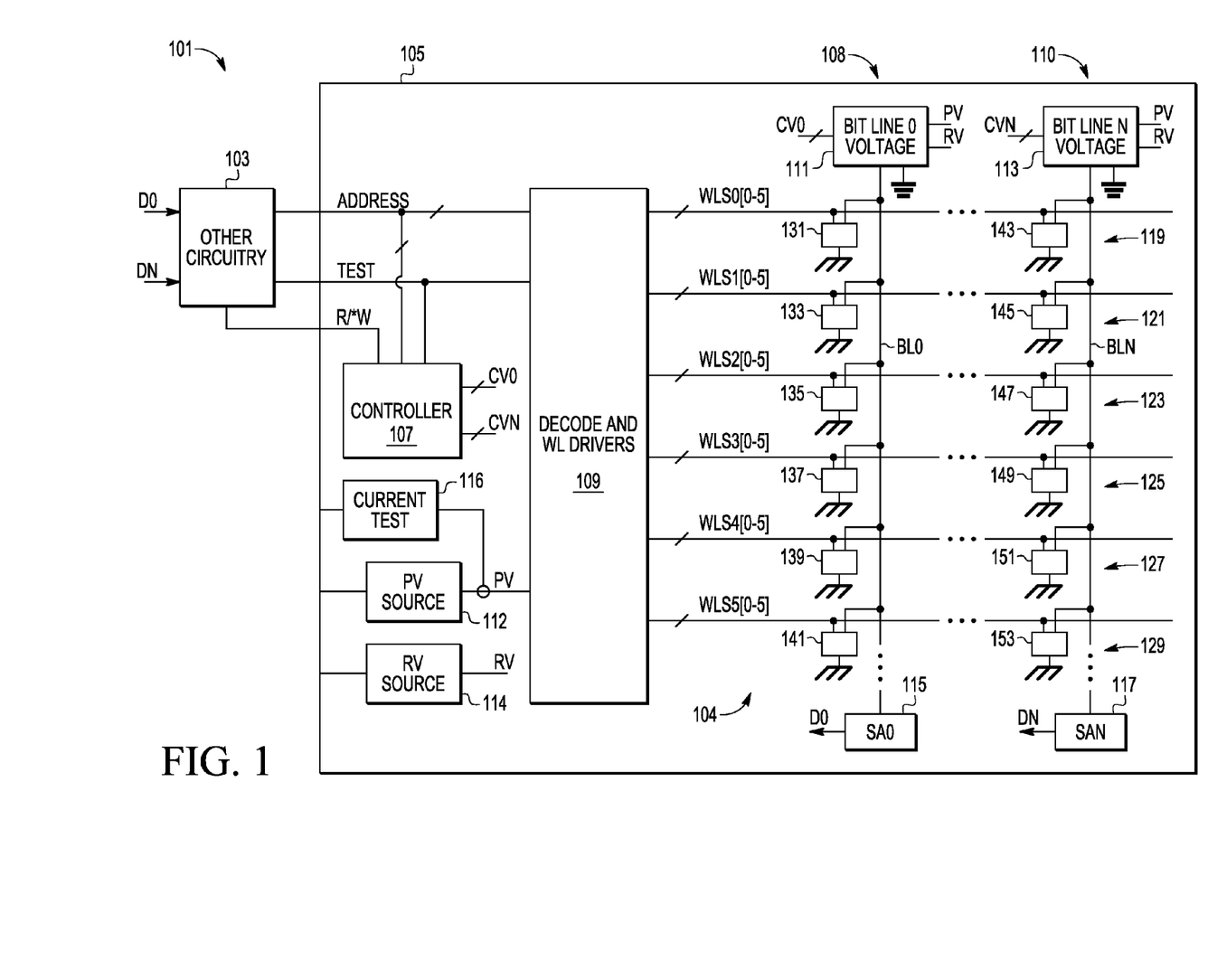
FIG. 1 is a block diagram of an integrated circuit with a fuse circuit according to one embodiment of the present invention.

FIG. 1 is a block diagram of an integrated circuit according to one embodiment of the present invention. In the embodiment shown, integrated circuit 101 includes a fuse circuit 105 and other circuitry 103. In one embodiment, other circuitry 103 can include a number of other types of circuits such as processors, voltage regulators, logic, memories, analog circuitry, etc. In one embodiment, the other circuitry 103 may be implemented on different integrated circuits (not shown).

Fuse circuit 105 includes a controller 107, a decode and word line driver circuit 109, an array 104 of fuse cells, sense amplifiers 115 and 117, and bit line voltage control circuits 111 and 113. Array 104 includes a number of fuse cells (131, 133, 135, 137, 139, 141, 143, 145, 147, 149, 151, 153)) that are arranged in rows 119, 121, 123, 125, 127, and 129 and columns 108 and 110. In the embodiment shown, each cell located in a column is connected to a bit line (e.g. BL0, BL1), where the cells of column 108 are connected to BL0 and the cells of column 110 are connected to BLN.

In the embodiment shown, each fuse cell (e.g. 131) of array 104 includes a fuse (e.g. fuse 201 of FIG. 2) for storing a data value that is used during the operation of a system implementing integrated circuit 101. In one embodiment, each fuse is an electrically programmable fuse whose fuse state is programmed by providing a programming current through the terminals of the fuse. In some embodiments, the "blown" or "programmed" fuse state is a high resistive state and the non programmed state is a low resistive state. However, in other embodiments, the "blown" or "programmed" state is a low resistive state and the non programmed state is a high resistive state. In one embodiment, the fuse element of a fuse is a narrow width poly silicon structure. In other embodiments, the fuse element may be a silicided poly silicon or a metal strip. In yet other embodiments, the fuse element may be a capacitor dielectric, e.g. as with a type of fuse that is sometimes referred to as an antifuse. In yet other embodiments, the fuse may be any other device that has electrical characteristics permanently altered through the application of a sufficiently high current. However, other types of fuses may be used in other embodiments.

In the embodiment shown, the cells of each row are connected to a set of word lines. For example, cells 131 and 143 of row 119 are connected word line set WLS0 and cells 133 and 145 of row 121 are connected word line set WLS1. In the embodiment shown, each word line set includes 6 word lines [0-5], however, the sets may a different number of word lines (e.g. 2 or more) in other embodiments. In other embodiments, an array of fuse cells may have a different number of rows and/or a different number of columns.

In the embodiment shown, a cell of array 104 is accessed for reading or programming by asserting the set of word lines of the row of the cell and applying a read voltage (RV) or program voltage (PV) to the bit line (BL0, BLN) of the cell depending upon whether the access is a read or program access. For example, to program cell 137 of row 125, the word lines of word line set WLS3 are asserted and a programming voltage is applied to bit line BL0 by bit line voltage control circuit 111. In the embodiment shown, to read cell 151, the word lines of word line set WLS4 are asserted and a read voltage (RV) is applied by bit line voltage control circuit 113 to bit line BLN. During a read or program operation, word lines and bit lines connected to non asserted rows and bit lines, respectively, are biased at non asserted or non selected voltages (e.g. ground). During a read operation, the read data (D0, DN) is provided by sense amplifiers (115 and 117) that are connected to the bit lines. In one embodiment, multiple data (one bit from each bit line) can be read during a read operation. In other embodiments, only one fuse cell can be read or programmed at a time. However in other embodiments, multiple fuse cells of a row can be programmed at one time.

The voltage of each bit line is controlled by a bit line voltage control circuit (111, 113). Each bit line voltage control circuit (111, 113) receives a program voltage and a read voltage from a program voltage source 112 and a read voltage source 114, respectively. The control circuits 111 and 113 also receive a ground voltage from a system ground terminal. During operation, the voltage control circuits 111 and 113 provide the desired voltage (PV, RV, ground) to the bit line as per a control signal (CV0, CVN) from controller 107, depending upon the operation to be performed.

In some embodiments, voltage sources 112 and 114 can be any of a number of voltage source types that provide a voltage at a specified level such as e.g. a voltage regulator, a voltage divider, or a charge pump. The voltage sources receive their power externally from power sources such as batteries, solar cells, AC terminals, or other power sources of the system. In some embodiments, power sources 112 and 114 have terminals to receive their power from external terminals of a tester. In some embodiments, the voltage sources may be part of the other circuitry 103 in that they provide voltages to circuits of other circuitry 103 as well. In some typical embodiments, the voltage sources may be located externally to integrated circuit 101. In some embodiments, an adjustable voltage source can be used to provide both the program voltage and the read voltage. Fuse circuit 105 includes a current test circuit 116 that is configured to read the current of the output of PV source 112. In the embodiment shown, circuit 116 provides an indication of the current read to external circuitry. In some embodiments, test circuit 116 is located external to fuse circuit 105.

Figure 3:
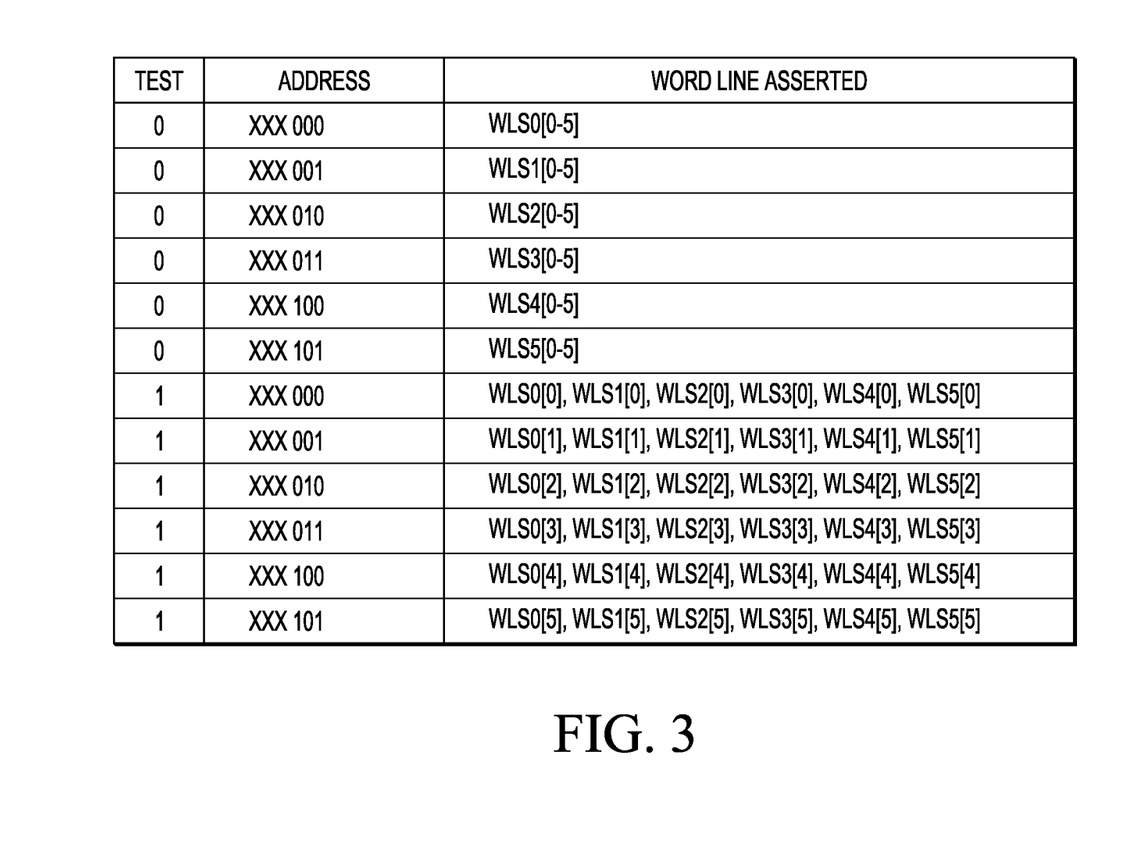
FIG. 3 is a logic table showing the operation of a decode circuit according to one embodiment of the present invention.

Decode and word line driver circuit 109 includes decode circuitry that determines which word lines are asserted during read, program, and programming test operations based on the address signals (ADDRESS) and test signal (TEST) provided to the decode circuitry. See for example, the table of FIG. 3 showing the word lines asserted as a function of the address and test signals values. In the embodiment shown, the address and test signals are provided by other circuitry 103. Circuit 109 also includes a number of word line drivers (not shown). The output of each word line driver is connected to a corresponding word line of the word line sets for driving the voltage of the word line to an asserted level in response to the decode circuitry of circuit 109 indicating that the word line should be asserted for the particular operation. Controller 107 receives from the other circuitry 103, the read/write signal (R/*W), which indicates whether the access is a program or read operation. Controller 107 also receives the Address signals.

Figure 2:
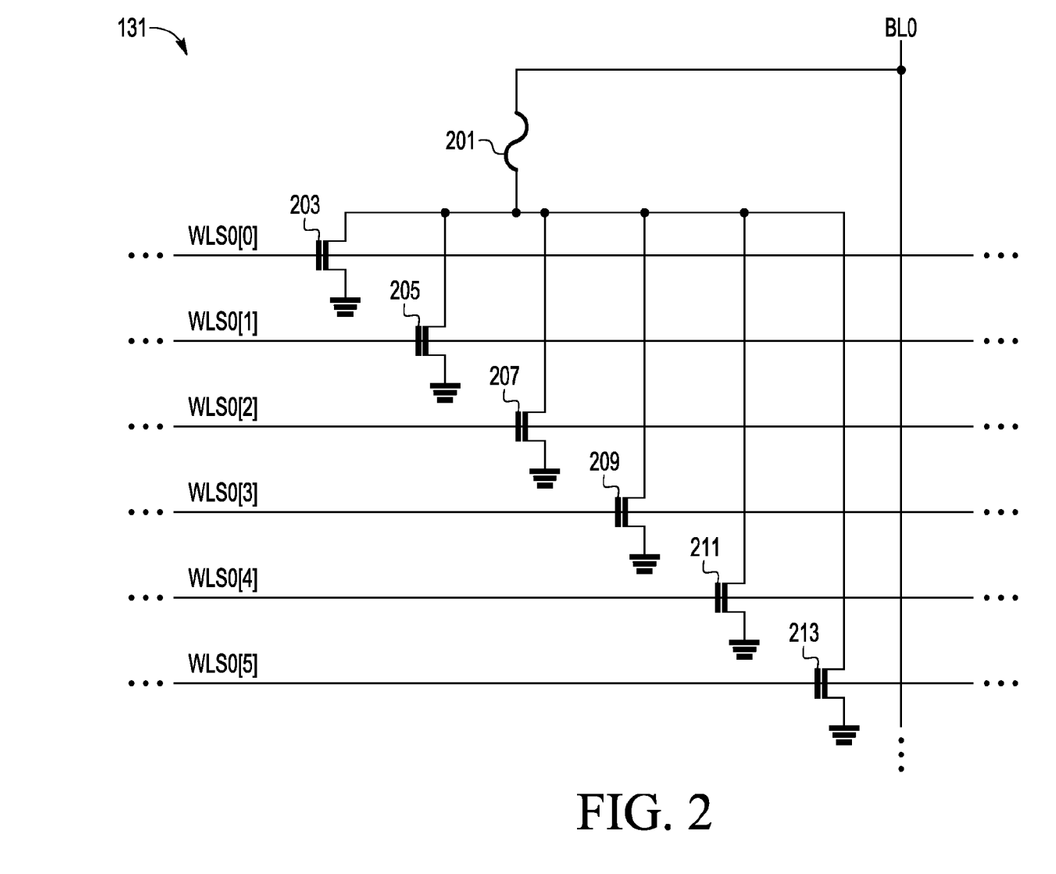
FIG. 2 is a circuit diagram of a fuse cell according to one embodiment of the present invention.

FIG. 2 is a circuit diagram of a fuse cell according to one embodiment of the present invention. In FIG. 2, fuse cell 131 is shown. The other fuse cells of array 104 have a similar configuration. Fuse cell 131 includes a fuse 201 having a first terminal connected to the bit line BL0 and a second terminal connected to the drains of select transistors 203, 205, 207, 209, 211, and 213. In the embodiment shown, each select transistor is an NMOS transistor with its source connected to a ground terminal. The gate of each select transistor is connected to a separate word line of a word line set that is connected to the fuse cell (e.g. WLS0 for cell 131). For example, the gate of transistor 203 is connected word line WLS0[0] and the gate of transistor 211 is connected word line WLS0[4]. Corresponding select transistors of other fuse cells (e.g. cell 143) of the row (e.g. 119) are also connected to the word lines of word line set (e.g. WLS0) accordingly. The select transistors of other fuse cells of other rows are also connected to the word lines of the word line sets of those rows accordingly.

During one embodiment of a program operation of cell 131, each select transistor (203, 205, 207, 209, 211, and 213) is made conductive by the assertion of the word line connected to its gate. With a programming voltage (PV) applied to bit line BL0, making each select transistor conductive causes a cumulative programming current to be pulled through fuse 201 at a level and duration that causes fuse 201 to "blow" to change its resistive state. In one embodiment, the programming voltage is 2 Volts, the cumulative programming current through fuse 201 is 10 mA, and the programming duration is 10 microseconds. However other programming voltages, currents, and/or durations may be used in other embodiments.

To read the programmed state of a fuse cell, the word lines of a word line set are each asserted to make conductive each select transistor (203, 205, 207, 209, 211, and 213) so as to provide a conductive path from fuse 201 to ground. If the fuse is at a high resistive state (e.g. a programmed state in some embodiments), the sense amplifier senses a voltage relatively close to the read voltage (RV) applied to the bit line (BL0). If the fuse is at a low resistive state, then the sense amplifier reads a positive voltage relatively close to ground, through the select transistors due to fuse 201 being conductive.

In some embodiments, less than all (e.g. one) select transistor of transistors 203, 205, 207, 209, 211, and 213 would be made conductive during a read operation. With such an embodiment a lesser number of word lines of a word line set would be asserted during a read operation. In such an embodiment, other word lines of the set would not be asserted during the read to reduce power consumption. In some embodiments, the rows may include separate program word lines and read word lines and the cells would include separate program select transistors and read select transistors that are separately used for programming and read operations. In some embodiments, multiple transistors are controlled by one word line.

Referring back to FIG. 1, fuse circuit 105 includes a test mode where programming circuitry of fuse circuit 105 can be placed in programming conditions without generating a sufficient programming current across a fuse to blow the fuse. In the embodiment shown, during a programming test operation, circuit 109 asserts less than all (e.g. only one) word lines of a word line set during the operation.

In one example, when a programming test operation is performed on cell 131, only one word line of word line set WLS0 is asserted during the programming test operation. During the programming test operation, a program voltage (PV) is applied to bit line BL0. Because only one (or less than all) of the select transistors 203, 205, 207, 209, 211, and 213 is conductive during the programming test operation, the resistance of the path to ground from fuse 201 is increased, thereby decreasing the amount of programming current flowing through fuse 201. In the embodiment shown, if only one of six select transistors is made conductive during a programming test operation, then only approximately ⅙ of the programming current will flow through fuse 201 during the test operation. Because a reduced amount of programming current flows through fuse 201 during a programming test operation, that current is insufficient to blow fuse 201 for changing its fuse state.

During a programming test operation as described above, a programming voltage can be applied to the bit line without blowing a fuse. Thus, the bit line voltage control circuit (111) and programming voltage source circuit (112) can be tested at the programming voltage without blowing a fuse.

In a further embodiment, select transistors of different cells of the column are made conductive during the programming test operation so that a programming current drawn by a bit line from the bit line voltage control circuit (e.g. 111) and programming voltage source 112 (e.g. generator, voltage regulator, charge pump) is of an amount that is sufficient to blow a fuse. However, because the programming current is provided to a number of fuse cells of the column, the amount provided to any one fuse cell is insufficient to blow the fuse of the fuse cell. For example, to perform a programming test operation of a fuse cell (e.g. 131) of a bit line (e.g. BL0), one word line of each word line set (from sets WLS0, WLS1, WLS2, WLS3, WLS4, and WLS5) is asserted is so that one select transistor from each of cells 131, 133, 135, 137, 139, and 141 is asserted during the programming test operation. Thus, during the programming test operation, each fuse of fuse cells 131, 133, 135, 137, 139, and 141 receives only ⅙ of the programming current, which is insufficient to blow any of the fuses of those cells.

Accordingly, by asserting only one select transistor from each cell (or less than all of the select transistors in some embodiments), the programming current through each cell (and through the fuse of each cell) is limited to a portion (e.g. ⅙) of the programming current, which is not sufficient to blow any of the fuses of the cells. However, the total programming current drawn from the voltage control circuit (e.g. 111) connected to the bit line is approximately equal to the programming current that is supplied to a cell during a programming operation. Thus, during a programming test operation, the bit line voltage control circuit (111), the programming voltage source (112), and select transistors that are connected to asserted word lines can be tested at conditions (e.g. programming voltage, programming current, and duration) that is sufficient to program a fuse, yet does not actually program a fuse due to spreading the programming current through the different cells.

Referring back to FIG. 1, the decode circuitry of circuit 109 enables the word lines to be asserted differently for programming operations and for programming test operations so that a fuse is blown during a program operation and so that no fuse is blown during a programming test operation. As stated earlier, in one embodiment, during a programming operation, all of the word lines of a word line set (e.g. WLS1) are asserted to make conductive all of the select transistors of a fuse cell to program the fuse of the cell. However, to perform a programming test operation of a cell of a row, only one of the word lines (e.g. word line WLS1[4]) of the word line set (WLS1) is made conductive to assert only one select transistor of the cell (145). With some embodiments, during a programming test operation, the decode circuitry would make conductive a word line of other word line sets (e.g. WLS0[4], WLS2[4], WLS3[4], WLS4[4], and WLS5[4]) to make a select transistor of other cells conductive to generate a sufficient programming current through a bit line control voltage circuit, without blowing any of the fuses of cells connected to the bit line being tested (e.g. BL1).

By asserting only one word line per set for 6 sets, each select transistor that is asserted receives ⅙ of the programming current, which is the same amount of programming current that the select transistor receives during a programming operation. Thus, during a programming test operation, a select transistor of a fuse cell can be tested at programming conditions without blowing the fuse of the cell.

Although FIG. 1 sets forth one embodiment of an integrated circuit and FIG. 2 sets forth one embodiment of a fuse cell, integrated circuits and fuse cells may have other configuration in other embodiments.

FIG. 3 shows a table setting forth one embodiment of the operation of the decode circuitry of circuit 109 during programming operations and programming test operation of the fuse cells of FIG. 1. The operations shown are for programming cells and testing cells of either bit line shown in FIG. 1. In one embodiment, whether the decode circuitry operates in programming mode to perform programming operations or test mode to perform test operations depends upon the value of the test signal (TEST). Accordingly, the specific combinations of word lines asserted during a program operation or a programming test operation depends upon the state of the test signal and address signal lines. The decode circuitry decodes those values and activates the appropriate word drivers to assert the corresponding word lines.

In FIG. 3, the first six table entries represent programming operations to a cell of a specific row of cells of array 104. The first entry is for programming a cell in row 119, the second entry is for programming a cell in row 121, the third entry is for programming a cell in row 123, and so on. The specific column of the cell being programmed would be determined by other address bits not specified in the address column of FIG. 3. Other information may be contained in the bits that are represented by "X," however their specific value is not relevant to the discussion of FIG. 3. For the first 6 entries, the test bit is "0" indicating that the fuse circuit is in a non test mode where the operations to be performed are program operations to change the program state of a fuse of a cell.

As shown in the first entry of FIG. 3, to program a cell of row 119, the other circuitry (e.g. a processor) provides an address of "XXX000" and a test signal of "0". In response, circuit 109 asserts all of the word lines (WLS0[0-5]) of word line set WLS0 to program a cell or cells of row 119. See the first entry of the column entitled "Word Line Asserted" of FIG. 3 where it lists word lines "(WLS0[0-5])." During the program operation, the other word lines of the other word line sets are not asserted. Controller 107 signals the bit line voltage control circuits to provide the appropriate voltages (e.g. PV or 0 volts) to the bit lines during a program operation depending upon whether the bit line is connected to a cell to be programmed (PV volts) or not (0 volts).

The last 6 entries of FIG. 3 set forth asserted word lines for test programming operations. In performing a programming test operation, the test signal is asserted ("1"). When the test signal is asserted, the decode circuitry of circuit 109, in response to an address, asserts only one word line per each word line set to activate one select transistor for each of a group of cells during the programming test operation. For example, if the address XXX000 is provided on the address lines, then circuit 109 asserts word lines WLS0[0], WLS1[0], WLS2[0], WLS3[0], WLS4[0], and WLS5[0]. All the other word lines are not asserted. In response, the select transistors connected to those word lines are made conductive to each pull ⅙ of the programming current through the fuse of those cell during the programming test operation. The other 5 select transistors of the cell are non conductive so only ⅙ of the current is pulled through the cell.

To test a different set of select transistors of the fuse cells, a different address would be provided on the address lines. For example, in response to an address of XXX100, circuit 109 asserts word lines WLS0[4], WLS1[4], WLS2[4], WLS3[4], WLS4[4], and WLS5[4] to make conductive the select transistors controlled by those word lines during a programming test operation. Accordingly, by being programmed according to the table of FIG. 3, all of the select transistors of each fuse cell can be tested without blowing the fuses of the cells. Furthermore, each select transistor can be addressably selected for testing from the other select transistors of the fuse cell during a test mode.

In other embodiments, the number of select transistors per cell and word lines per word line sets may be different. For example, in some embodiments, each word line set may include only 2 word lines per set. Others may have 4 or 8 select word lines per set. In some embodiments, the number of word lines per set would depend upon how much the programming current would need to be reduced to ensure that fuses are not programmed during a programming test operation. In yet some other embodiments, the number of wordlines per wordline set could vary from one row to another within an array.

Also with other embodiments, the groupings of the word lines for the programming test operations may be different. For example, the select lines for each test operation may have select lines from different combinations of word line sets. Also, the select transistors of each cell tested in a programming test operation may be at different corresponding locations. For example, a programming test operation involving word line WLS0[1] may include asserting word lines of different word line sets than for a programming test operation that asserts word line WLS0[2]. For example, WLS0[1] may be tested with WLS5[2], WLS9[3], and WLS13[4] whereas WLS0[2] may be tested with WLS4[0], WLS8[2], and WLS12[3]. Word lines WLS9[3], WLS13[4], WLS8[2], and WLS12[3] are from word line sets that are connected to rows not shown in FIG. 1.

In other embodiments, controller 107 includes an internal test circuit (not shown) that when the test signal is asserted, the test circuit of controller 107 controls circuit 109 to walk through the different sets of asserted word lines for the programming test operations.

Figure 4:
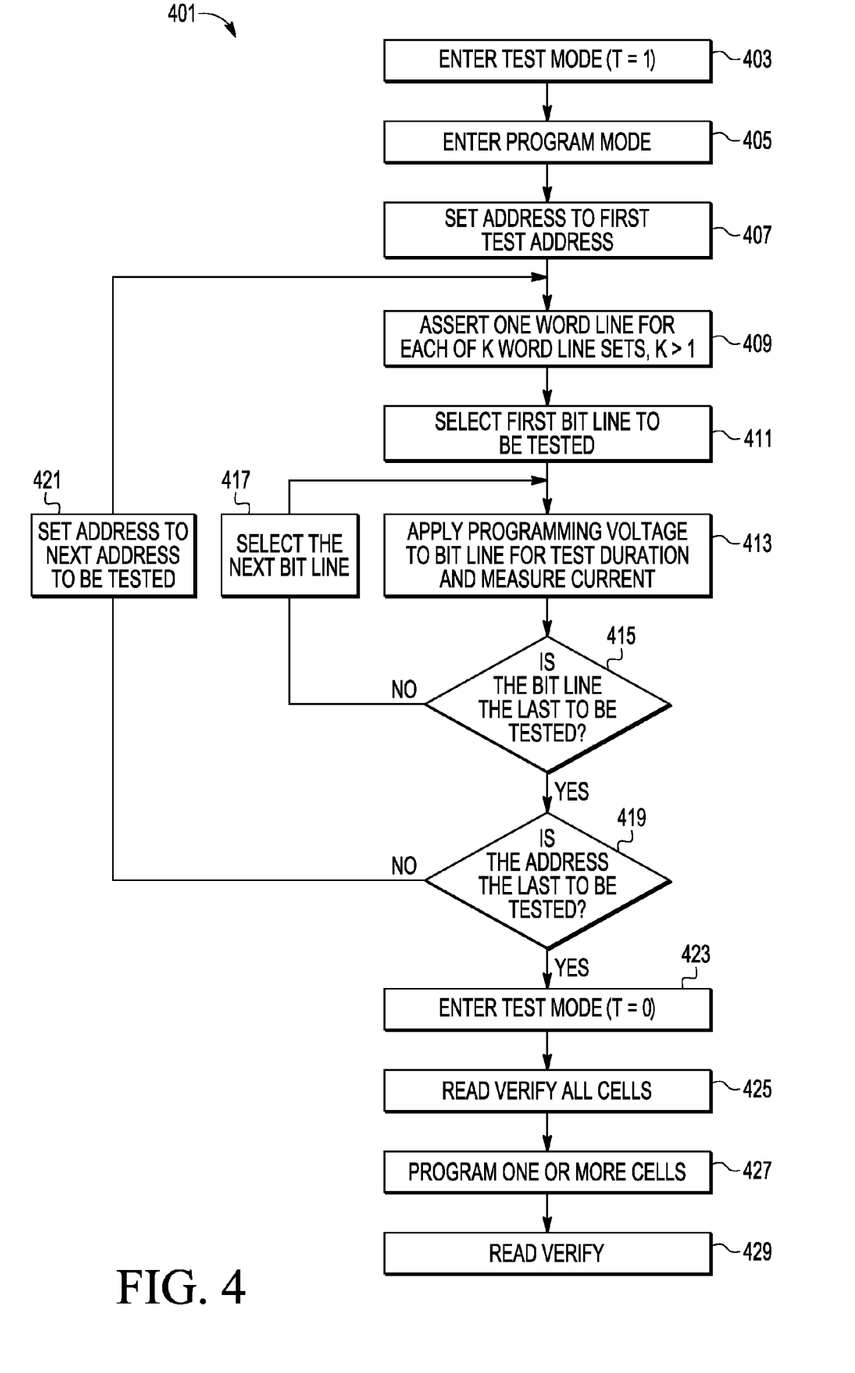
FIG. 4 is a flow diagram of a test procedure according to one embodiment of the present invention.

FIG. 4 shows one embodiment of a procedure 401 for testing a fuse circuit having a test mode according to one embodiment of the present invention. In one embodiment, the procedure may be performed after manufacture in a test lab where the integrated circuit is coupled to test equipment such as automated test equipment (ATE). In one example, the procedure may be performed as part of burn in testing where the integrated circuit is subjected to stress conditions (higher voltages and/or temperatures) in order to age test the device. In some examples, procedure 401 may be run under the stress conditions or run after the circuit is operated under stress conditions. However, the test procedures described herein may be run at other times during the life of the part, including before or after assembly of the integrated circuit in a system and during operation of the system, or at the end of life of the operation of the system.

Procedure 401 begins at action 403 where the fuse circuit is placed in test mode by the assertion of the test signal to T=1. In some embodiments, the test signal is asserted by a test control module of the other circuitry 103. In other embodiments, the test signal is provided by an external testing circuit such as an ATE system. The test control module can be implemented as a hardware controller or a processor executing code to control the testing procedure.

In action 407, the test control module provides on the address lines, the first address to be tested. In action 409, the decode circuitry of circuit 109, in response to the address, asserts one word line from each of K word line sets, where K is the number of word lines per set. In the embodiment of FIG. 1, K=6, but can be of other values in other embodiments. In action 411, controller 107, in response to the address, selects the first bit line (e.g. BL0) to be tested.

In action 413, a programming test operation is performed where a programming voltage (PV) is applied to the selected bit line for a duration of the programming test operation. During the programming test operation, the select transistors connected to the asserted word lines are made conductive to draw a portion of the programming current through their respective cells. In some embodiments during the programming test operation, the current of the output of PV source 112 that provides the programming current is measured by current test circuit 116. That measurement can be provided to external circuitry. If the measured current is out of tolerance (either too high or too low), the programming test operation would indicate that there is an error with the circuitry being tested. In some embodiments, a current read would only be performed for a subset of the programming test operations.

After action 413, a determination 415 is made whether the last bit line has been tested. If no, then in action 417, the next bit line is selected and the programming test of action 413 is run again. When the last bit line has been tested, a determination 419 is made of whether the last address has been tested. If no, in determination 419, the next address to be tested is set in action 421 where actions 409, 411, 413, and 417, and determinations 415 and 419 are performed to complete the programming test operations for the next addresses. When all of the programming test operations for all of the addresses are complete, the test controller exits the test mode by setting T=0 in action 423.

In the embodiment shown, in action 425, a read is performed of all addresses to determine if the fuses are in the proper non programmed state after performing the programming test operations. In performing these reads, the test signal is set to "0" where the address provided by the test control module asserts all word lines of a word line set (or all programming word lines of a word line set).

In the embodiment shown, in action 427, a few of the fuse cells may be programmed during testing to further test the programming circuitry and the fuses themselves. In action 429, these fuse cells are then read to verify that the proper fuse state was obtain for these cells as a result of the programming. Although this programming action 427 and subsequent read verify action 429 are not performed in some embodiments.

Accordingly, the test procedure shown in FIG. 4 provides a procedure where the programming voltage sources, bit line control circuitry, bit lines, and select transistors can be tested under programming conditions without having to program fuses during the programming test operations. In embodiments where some fuses are programmed as part of the testing procedures, the procedure allows for the minimization of the number of fuses required to be programmed. This may advantageously improve the reliability of the fuse circuits provided to customers in that defective circuits can be determined and removed before shipping.

In other embodiments, a test procedure may have a greater or lesser number of actions and/or the actions may be performed in a different order. For example, in some embodiments, all of the cells of a bit line may be tested before proceeding to the next bit line. Also, the procedure of FIG. 4 may be run at different programming voltages, at different temperatures, and/or for different durations. In some embodiments, a read may be performed at times in between the test operations to determine if further testing needs to be made.

In other embodiments, the programming test operations may be performed with a different number of asserted word lines per each iteration of the procedure. For example, during a first run of the procedure, a smaller number of word lines may be asserted to a programming test operation than during a second run of the procedure. Also in some embodiments, the number of select transistors per cell that are enabled during a programming test operation may change with subsequent iterations. These variations may be implemented with additional control signals provided to the decoder of circuit 109.

In one embodiment, a method of operating a fuse cell includes performing a test operation on a fuse cell including a fuse by making conductive at least one but less than all of a plurality of select transistors of the fuse cell while applying a first voltage to a terminal of fuse cell. During the test operation, current flows from the terminal of the fuse cell through the fuse and through the at least one but less than all of the plurality of select transistors. The fuse is programmed by a program operation where all of the plurality of select transistors are made conductive while applying the first voltage to the terminal where a programming current flows from the terminal through the fuse to program the fuse.

In another embodiment, a fuse circuit includes a fuse array including a plurality of fuse cells arranged in a set of rows and a set of at least one column. The fuse circuit includes a plurality of sets of word lines. Each set of word lines of the plurality is coupled to fuse cells of a row of the set of rows. The fuse circuit includes a set of at least one bit line. Each bit line of the set of at least one bit line is coupled to fuse cells of a column of fuse cells of the set of at least one column. The fuse circuit includes a selection circuit coupled to the plurality of sets of word lines. During a program operation of a fuse cell of the plurality of fuse cells, the selection circuit asserts all of the word lines of a set of word lines coupled to the fuse cell. During a test operation of a fuse cell of the plurality of fuse cells, the selection circuit asserts less than all of the word lines of a set of word lines coupled to the fuse cell. During a program operation and during a test operation of a fuse cell, a first voltage is applied to a bit line of the set of at least one bit line coupled to the fuse cell.

In another embodiment, a fuse circuit includes a fuse cell. The fuse cell includes a plurality of select transistors and a fuse having a first terminal coupled to a first current terminal of each of the plurality of select transistors and a second terminal coupled to a first voltage terminal to receive a first voltage during both a test operation and a program operation of the fuse cell. The fuse circuit includes a select circuit that selects at least one but less than all of the select transistors of the plurality of select transistors to be made conductive during a test operation of the fuse cell and selects all of the select transistors of the plurality of select transistors to be made conductive during a program operation of the fuse cell.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of operating a fuse cell, comprising:
   performing a test operation on a fuse cell including a fuse by making conductive at least one but less than all of a plurality of select transistors of the fuse cell while applying a first voltage to a terminal of fuse cell, wherein during the test operation, current flows from the terminal of the fuse cell through the fuse and through the at least one but less than all of the plurality of select transistors; and wherein the fuse is programmed by a program operation where all of the plurality of select transistors are made conductive while applying the first voltage to the terminal where a programming current flows from the terminal through the fuse to program the fuse.

2. The method of claim 1, further comprising:
   wherein the fuse cell is read by a read operation where at least one of the plurality of select transistors is made conductive while applying a second voltage to the terminal, wherein the second voltage is less than the first voltage.

3. The method of claim 1 wherein:
   the terminal is coupled to a bit line;
   a second fuse cell includes a second terminal coupled to the bit line, wherein the second fuse cell includes a second fuse;
   the performing the test operation further includes making conductive at least one but less than all of a second plurality of select transistors of the second fuse cell while applying a first voltage to the second terminal, wherein during the test operation, current flows from the second terminal of the second fuse cell through the second fuse and through the at least one but less than all of the second plurality of select transistors.

4. The method of claim 3 wherein:
   a conductivity of the plurality of select transistors is controlled by a first set of select lines and a conductivity of the second plurality of select transistors is controlled by a second set of select lines;
   wherein during a programming operation of the fuse cell, all of the first set of select lines are asserted to make all of the plurality of select transistors conductive;
   wherein during a programming operation of the second fuse cell, all of the second set of select lines are asserted to make all of the second plurality of select transistors conductive while applying the first voltage to the second terminal where a programming current flows from the second terminal through the second fuse to program the second fuse;
   wherein during the performing the test operation, only one select line of the first set of select lines is asserted and only one select line of the second set of select lines is asserted.

5. The method of claim 3 wherein during a program operation of the fuse cell, the second plurality of select transistors is not made conductive.

6. The method of claim 3 wherein the current that flows from the terminal through the fuse and the current that flows from the second terminal through the second fuse during the test operation is each less than the programming current.

7. The method of claim 1 wherein the current that flows from the terminal of the fuse cell through the fuse during the test operation is less than the programming current and is insufficient to program the fuse.

8. The method of claim 1 further comprising:
   after the performing a test operation on the fuse cell, performing a second test operation on the fuse cell by making conductive at least a second one but less than all of the plurality of select transistors of the fuse cell while applying a first voltage to the terminal of the fuse cell, wherein during the second test operation, current flows from the terminal of the fuse cell through the fuse and through the at least the second one but less than all of the plurality of select transistors;
   wherein at least one of the at least the second one but less than all of the plurality of select transistors includes a select transistor that is not made conductive during the performing the test operation on the fuse cell.

9. A fuse circuit, comprising:
a fuse array including a plurality of fuse cells arranged in a set of rows and a set of at least one column;
a plurality of sets of word lines, each set of word lines of the plurality is coupled to fuse cells of a row of the set of rows;
a set of at least one bit line, each bit line of the set of at least one bit line is coupled to fuse cells of a column of fuse cells of the set of at least one column;
a selection circuit coupled to the plurality of sets of word lines, during a program operation of a fuse cell of the plurality of fuse cells, the selection circuit asserts all of the word lines of a set of word lines coupled to the fuse cell, during a test operation of a fuse cell of the plurality of fuse cells, the selection circuit asserts less than all of the word lines of a set of word lines coupled to the fuse cell, wherein during a program operation and during a test operation of a fuse cell, a first voltage is applied to a bit line of the set of at least one bit line coupled to the fuse cell.

10. The fuse circuit of claim 9 wherein during a programming operation of a fuse cell of the plurality of fuse cells, a programming current of a magnitude to program a fuse of the fuse cell is provided to the fuse cell from a bit line of the set of at least one bit line coupled to the fuse cell, wherein during a test operation of a fuse cell of the plurality of fuse cells, current of a magnitude insufficient to program a fuse of the fuse cell is provided to the fuse cell from a bit line of the set of at least one bit line coupled to the fuse cell.

11. The fuse circuit of claim 9 wherein during a test operation of a fuse cell of the plurality of fuse cells, the selection circuit asserts for each row of a group of at least two rows of the set of rows, less than all of the word lines of a set of word lines of the each row of the group, wherein a row of the fuse cell is included in the group.

12. The fuse circuit of claim 11 wherein each set of word lines of the plurality of sets of word lines includes K number of word lines where K is an integer greater than one, wherein the group consists of K rows, wherein the selection circuit asserts only one word line of a set of word lines for each row of the group during a test operation of the fuse cell.

13. The fuse circuit of claim 9 wherein during a set of test operations of a fuse cell, for each test operation of the set of test operations, the selection circuit asserts a different combination of at least one word line but less than all word lines of a set of word lines coupled to the fuse cell such that all word lines of the set of word lines are asserted at least once during the set of test operations, wherein during each test operation of the set of test operations, a current passes through a fuse of the fuse cell that is insufficient to program the fuse.

14. The fuse circuit of claim 9 wherein during a programming operation of a fuse cell of the plurality of fuse cells, the selection circuit does not assert sets of word lines of the plurality of sets of word lines of rows of the set of rows that do not include the fuse cell.

15. A fuse circuit, comprising:
a fuse cell comprising:
a plurality of select transistors;
a fuse having a first terminal coupled to a first current terminal of each of the plurality of select transistors and a second terminal coupled to a first voltage terminal to receive a first voltage during both a test operation and a program operation of the fuse cell;
a select circuit that selects at least one but less than all of the select transistors of the plurality of select transistors to be made conductive during a test operation of the fuse cell and selects all of the select transistors of the plurality of select transistors to be made conductive during a program operation of the fuse cell.

16. The fuse circuit of claim 15, wherein during a read operation of the fuse cell, the second terminal of the fuse is coupled to receive a second voltage, the second voltage is a lower voltage than the first voltage.

17. The fuse circuit of claim 15 wherein:
current from the first voltage terminal passes through the fuse during a test operation of the fuse cell, wherein the current is insufficient to program the fuse;
programming current from the first voltage terminal programs the fuse during a program operation.

18. The fuse circuit of claim 15 further comprising:
a second fuse cell comprising:
a second plurality of select transistors;
a second fuse having a first terminal coupled to a first current terminal of each of the second plurality of select transistors and a second terminal coupled to the first voltage terminal to receive the first voltage during both a test operation and a program operation of the second fuse cell;
wherein during a test operation that tests the fuse cell and the second fuse cell, the select circuit selects less than all of the plurality of select transistors and less than all of the second plurality of select transistors to be made conductive, wherein current from the first voltage terminal passes through the fuse and the less than all the first plurality of select transistors and current from the first voltage terminal passes through the second fuse and the less than all of the second plurality of select transistors during the test operation that tests the first fuse cell and the second fuse cell;
wherein during a program operation of the fuse cell, none of the second plurality of select transistors are made conductive.

19. The fuse circuit of claim 18 wherein during a test operation that tests the fuse cell and the second fuse cell, only one select transistor of the plurality of select transistors is made conductive and only one select transistor of the second plurality of select transistors is made conductive.

20. The fuse circuit of claim 15 further comprising:
a plurality of sets of select lines, wherein each set includes K select lines where K is an integer greater than 1;
a plurality of fuse cells including the fuse cell, each fuse cell of the plurality of fuse cells including:
a plurality of select transistors;
a fuse having a first terminal coupled to a first current terminal of each of the plurality of select transistors of the each fuse cell and a second terminal coupled to a first voltage terminal to receive a first voltage during both a test operation and a program operation of the each fuse cell;
wherein for each fuse cell of the plurality of fuse cells, the select circuit asserts all of the select lines of a set of select lines of the plurality of sets coupled to the each fuse cell to make conductive all of the select transistors of the plurality of select transistors of the each fuse cell during a program operation of the each fuse cell;
wherein a during a test operation of a fuse cell of the plurality of fuse cells, the select circuit makes conductive one select line of each of K sets of the plurality of sets of select lines including the set coupled to the fuse cell of the test operation.

* * * * *